United States Patent
Lim et al.

(10) Patent No.: US 9,330,997 B1
(45) Date of Patent: May 3, 2016

(54) HEAT SPREADING STRUCTURES FOR INTEGRATED CIRCUITS

(71) Applicant: Altera Corporation, San Jose, CA (US)

(72) Inventors: Ken Beng Lim, Bayan Lepas (MY); Myung June Lee, Cupertino, CA (US); Yuan Li, Sunnyvale, CA (US); Ping Chet Tan, Gelugor (MY)

(73) Assignee: Altera Corporation, San Jose, CA (US)

( * ) Notice: Subject to any disclaimer, the term of this patent is extended or adjusted under 35 U.S.C. 154(b) by 20 days.

(21) Appl. No.: 14/211,999

(22) Filed: Mar. 14, 2014

(51) Int. Cl.
*H01L 23/367* (2006.01)
*H01L 21/48* (2006.01)

(52) U.S. Cl.
CPC .......... *H01L 23/367* (2013.01); *H01L 21/4882* (2013.01)

(58) Field of Classification Search
CPC ... H01L 23/36; H01L 23/367; H01L 23/3672; H01L 23/3675; H01L 23/34; H01L 23/4043; H01L 23/49568; H01L 2023/405
See application file for complete search history.

(56) References Cited

U.S. PATENT DOCUMENTS

| | | | |
|---|---|---|---|
| 6,239,486 B1* | 5/2001 | Shimizu ............... | H01L 23/055 257/676 |
| 6,246,115 B1* | 6/2001 | Tang et al. .................... | 257/706 |
| 6,813,154 B2 | 11/2004 | Diaz et al. | |
| 7,212,408 B2 | 5/2007 | Noble | |
| 7,342,298 B1* | 3/2008 | Zhang ........................... | 257/667 |
| 7,518,219 B2 | 4/2009 | Bish et al. | |
| 2011/0176279 A1* | 7/2011 | Zhao ................... | H01L 21/4878 361/720 |
| 2013/0043581 A1* | 2/2013 | Negoro ................... | H01L 23/13 257/712 |
| 2014/0167216 A1* | 6/2014 | Kalchuri ................ | H01L 23/50 257/531 |

FOREIGN PATENT DOCUMENTS

| WO | 9956515 | 11/1999 |
|---|---|---|
| WO | 2004097896 | 11/2004 |

* cited by examiner

*Primary Examiner* — Jose R Diaz

(57) ABSTRACT

A heat spreader structure includes a planar portion and a slanted portion. The slanted portion extends at an angle from an edge of the planar portion. The first slanted portion includes a first slot. A second heat spreader structure includes a planar member, a first edge member and a second edge member. The first edge member extends only perpendicularly from a first edge of the planar member whereas the second edge member extends from the second edge of the planar member and has a slanted surface with respect to that of the planar member. In addition to that, the first and second heat spreader structure may be formed using different manufacturing methods.

17 Claims, 7 Drawing Sheets

US 9,330,997 B1

HEAT SPREADING STRUCTURES FOR INTEGRATED CIRCUITS

BACKGROUND

A heat spreading structure helps to maintain a fixed temperature (i.e., the optimum temperature) within an integrated circuit package so that the integrated circuit package may perform its function optimally. The heat spreading structure may maintain the temperature by dissipating excess heat generated within the integrated circuit package.

Typically, a heat spreading structure may include a mid-portion region and a support structure. The mid-portion region is mounted on top of an integrated circuit die in the integrated circuit package. Generally, the mid-portion is where most of the excess heat generated by the integrated circuit die gets dissipated. The support structure supports the mid-portion region so that the mid-portion region is suspended over a package substrate in the integrated circuit package.

Generally, most heat spreader structures require a large package substrate surface area to accommodate the associated support structure. A flip-chip package, which generally has a small package substrate surface size, may not be able to mount such heat spreader structures.

In addition to that, many integrated circuit packages have active or passive circuits placed on its package substrate adjacent to the integrated circuit die. Such integrated circuit packages may further limit the area on which the support structure may be placed. Although there are solutions to such problems, for example, by placing passive or active devices within the package substrate, such solutions may be costly to implement.

SUMMARY

Embodiments described herein include integrated circuit heat spreading structures and methods to manufacture these heat spreading structures. It should be appreciated that the embodiments can be implemented in numerous ways, such as a process, an apparatus, a system, a device, or a method. Several embodiments are described below.

In one embodiment, a heat spreading structure includes a planar portion and a slanted portion. The slanted portion extends at an angle from an edge of the planar portion. The slanted portion includes a first slot. The heat spreading structure may be mounted on top of an integrated circuit die. Both the integrated circuit die and the heat spreading structure are mounted on a top surface of a package substrate. The slanted portion of the heat spreading structure may be coupled to the top surface of the package substrate. In addition to that, a method to form such spreading structure is also provided, in an alternative embodiment.

In another embodiment, another heat spreading structure is provided. The head spreading structure has a planar member that is formed over an integrated circuit die, a first edge member that extends only perpendicularly from a first edge of the planar member, and a second edge member that extends from a second edge of the planar member. The second edge member has a slanted surface with respect to that of the planar member. In addition to that, a method to form such heat spreader structure is also provided, in another embodiment.

Further features of the invention, its nature and various advantages will be more apparent from the accompanying drawings and the following detailed description of the preferred embodiments.

DETAILED DESCRIPTION

The following embodiments describe integrated circuit heat spreading structures and methods to manufacture these heat spreading structures. It will be obvious, however, to one skilled in the art, that the present exemplary embodiments may be practiced without some or all of these specific details. In other instances, well-known operations have not been described in detail in order not to unnecessarily obscure the present embodiments.

Figure 1A:
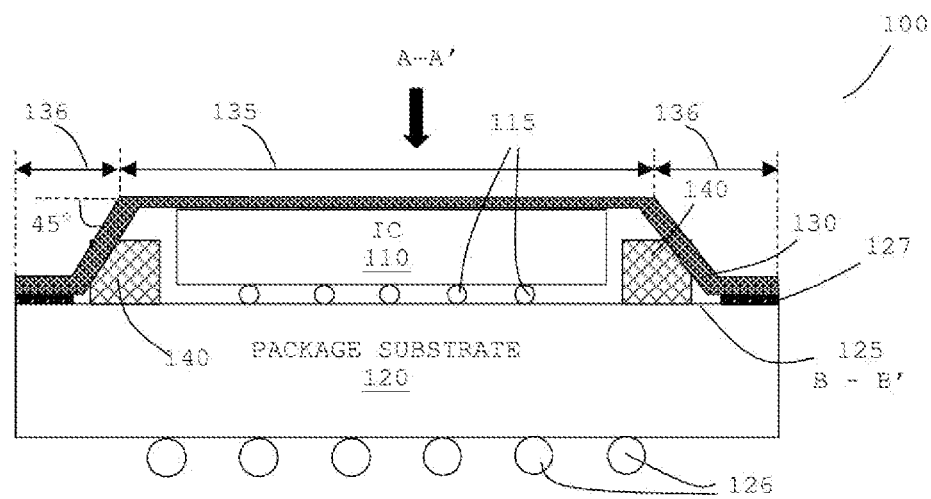
FIG. 1A shows a cross-sectional side view of an illustrative integrated circuit package in accordance with embodiments of the present invention.

FIG. 1A, meant to be illustrative and not limiting, shows a cross-sectional side view of an integrated circuit package 100 in accordance with one embodiment of the present invention. Integrated circuit package 100 may include integrated circuit 110, package substrate 120, heat spreader 130, and one or more circuit structures 140.

In one embodiment, integrated circuit package 100 is a circuit component in a system (e.g., a communication system). Integrated circuit package 100 may be utilized to perform complex tasks together with other circuit components in the system. Generally, the system, together with integrated circuit package 100, may be mounted on a printed circuit board (PCB). Signal traces on the PCB may route signals between different circuit components in the system.

In one embodiment, integrated circuit package 100 may be a programmable logic device (PLD), for example, a field programmable gate array (FPGA) device. Alternatively, integrated circuit package 100 may be an application specific integrated circuit (ASIC) device or application specific standard products (ASSP) device, such as, a memory device or a microprocessor device.

It should be appreciated that integrated circuit package 100 may also be associated with the manner in which integrated circuit 110 is coupled with package substrate 120, for example, a ball grid array (BGA) device, a chip scale package (CSP) device or a flip-chip (FC) device. In the embodiment of FIG. 1A, within integrated circuit package 100, integrated circuit 110 is mounted on surface 125 of package substrate 120. Such a configuration may be referred to as a flip-chip device.

Integrated circuit 110 may be coupled to package substrate 120 via interconnects 115. Interconnects 115 provide a means for transferring signals between integrated circuit 110 and package substrate 120. Interconnects 115 may be in the form flip-chip bump structures or copper pillar structures.

A bottom surface of package substrate 120 includes solder balls 126. Solder balls 126 may be used for transferring signals between integrated circuit package 100 and other external circuit elements, such as a PCB (not shown). In one embodiment, a portion of solder balls 126 may transfer signals (e.g., input/output (I/O) signals) whereas another portion of solder balls 126 may provide ground connections to integrated circuit package 100.

Package substrate 120 may include one substrate layer or multiple substrate layers (not shown in FIG. 1A) depending on the complexities of integrated circuit package 100. In one exemplary embodiment, a complex integrated circuit package 100 may have at least four to five substrate layers in package substrate 120.

In addition to that, the size of the surface (i.e., surface 125) of package substrate 120 may depend on various factors. In one exemplary embodiment, package substrate 120 may need a large surface to mount a large integrated circuit 110 (e.g., a large FPGA die). In another example, package substrate 120 may need a large surface to accommodate a plurality of circuit structures 140 placed on surface 125. Additionally, package substrate 120 may need to have a large enough surface area to accommodate certain types of heat spreader structures, such as the single piece lid (SPL) heat spreader. As an example, the surface area of package substrate 120 may be 40 millimeter (mm)×40 mm.

As shown in the embodiment of FIG. 1A, circuit structures 140 may be placed on surface 125 and adjacent to integrated circuit 110. In one embodiment, circuit structures 140 may include passive circuit structures (e.g., capacitors or on-package diodes (OPDs)) or active circuit structures (e.g., transistors).

As described above, integrated circuit 110 may be utilized for performing a variety of functions. As such, electrical signals may be transmitted through routing pathways (not shown) in integrated circuit 110. Electrical signals transmitted through these routing pathways may generate heat, which needs to be dissipated from integrated circuit 110 for optimal performance. Therefore, a heat spreader (e.g., heat spreader 130) is needed to dissipate excessive heat from integrated circuit package 100.

In the embodiment of FIG. 1A, heat spreader 130 is mounted on integrated circuit 110. The bottom surface of heat spreader 130 may directly touch the top surface of integrated circuit 110. Alternatively, there may be thermal interface material (TIM) interposed between heat spreader 130 and the top surface of integrated circuit 110. An air gap may be formed between the bottom surface of heat spreader 130 and the top surface of integrated circuit 110. However, air gaps are not desired because air gaps are less efficient at transferring heat out of an integrated circuit package.

In addition to that, heat spreader 130 may have a large surface area and a thin profile structure. A person skilled in the art appreciates that a large surface area and a thin profile structure may improve the heat dispersion capability of the heat spreader.

Heat spreader 130 may be formed from conductive materials such as copper. It should be appreciated that conductive materials may dissipate heat more effective compared to non-conductive materials.

Heat spreader 130 may include a mid-portion 135 and an edge-portion 136. The perimeter of mid-portion 135 is surrounded by edge-portion 136. Mid-portion 135 may be placed directly above the top surface of integrated circuit 110. In one embodiment, mid-portion 135 and edge-portion 136 may be formed using a single planar plate, as described later with reference to FIG. 4. Alternatively, mid-portion 135 and edge-portion 136 may be made from two different parts that are coupled together to form heat spreader 130.

Referring still to FIG. 1A, mid-portion 135 may have a planar surface. It should be appreciated that the planar surface may be preferred over a non-planar surface for mid-portion 135 because a planar surface may provide a maximum contact area between mid-portion 135 and the top surface of integrated circuit 110. Having a maximum contact area between heat spreader 130 (or more specifically, mid-portion 135) and integrated circuit 110 may improve heat dissipation from integrated circuit package 100.

Referring still to FIG. 1A, edge-portion 136 is bent along the plane of mid-portion 135. In one embodiment, edge-portion 136 may be bent at an angle of 45 degrees (as shown in FIG. 1A). As shown in the embodiment of FIG. 1A, one end of edge-portion 136 may be coupled to mid-portion 135 whereas another end of edge-portion 136 may be coupled to surface 125. View along line B-B' shows the location where edge-portion 136 couples surface 125. The detail of view along line B-B' is shown in FIG. 1C. Edge-portion 136 may be utilized for supporting the sides of heat spreader 130 as shown in FIG. 1A. The top view A-A' of mid-portion 135 and edge-portion 136 is shown in FIG. 1B.

Edge-portion 136 may be coupled to surface 125 with an adhesive material (e.g., adhesive material 127 of FIG. 1C). The adhesive material prevents heat spreader 130 from moving on surface 125.

Edge-portion 136 may include slots that provide an opening on edge portion 136 (details of which are described below with reference to FIG. 1B). The slots on edge-portion 136 may enable circuit structures 140 to be placed directly beneath edge-portion 136. In one embodiment, there may be more than one slot on edge-portion 136, for example, as shown by heat spreaders 200B-200C of FIGS. 3B-3D, respectively.

Figure 1B:
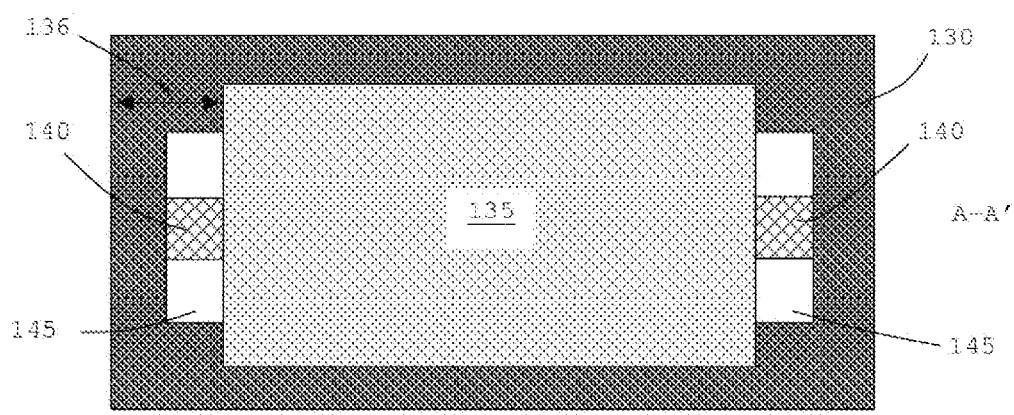
FIG. 1B shows a top view of an illustrative integrated circuit package in accordance with embodiments of the present invention.
Figure 1C:
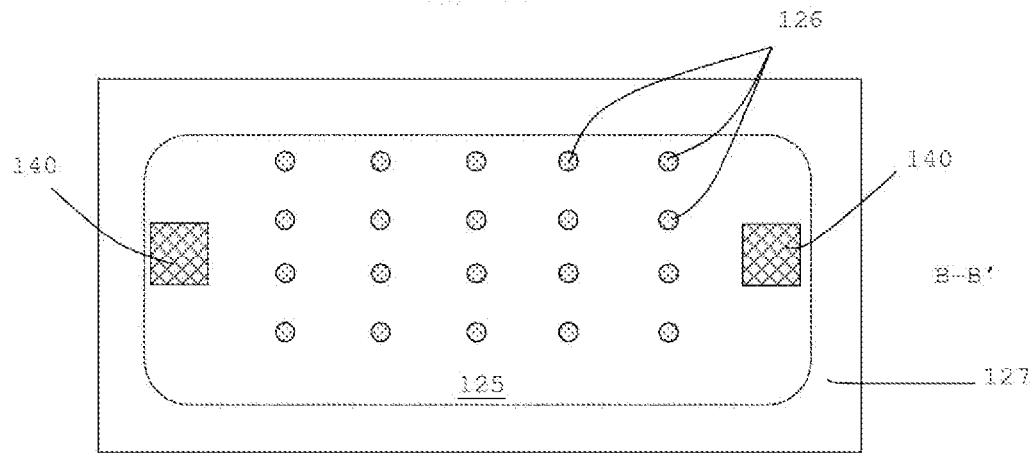
FIG. 1C shows top view of an illustrative package substrate surface for receiving an integrated circuit in accordance with one embodiment of the present invention.

FIG. 1B, meant to be illustrative and not limiting, illustrates a top view of integrated circuit package 100 in accordance with one embodiment of the present invention. In FIG. 1A, the top view is shown by the arrow A-A'. As shown in the top view, mid-portion 135 and edge-portion 136 may form a rectangular shape. In the embodiment of FIG. 1B, two slots 145 are located on two opposing sides of edge-portion 136.

The dimensions of slots 145 may depend on multiple factors, for example, the size of circuit structures 140. In one exemplary embodiment, the dimensions of slots 145 may be larger than the surface area of each of circuit structures 140 so that circuit structures 140 may be placed beneath edge-portion 136. It should be appreciated that the surface area of circuit structures 140 depends on the type of circuits used. For example, a capacitor or an on-package diode (OPD) may generally have a relatively large surface area compared to other circuits.

In addition to that, the dimensions of slots 145 may also depend on the angle at which edge-portion 136 is bent and the height of circuit structure 140. For example, slots 145 may have larger dimensions when edge-portion 136 is bent at a high angle (e.g., greater than 45 degrees) or when the height or thickness of circuit structures 140 is significantly greater than that of the integrated circuit (e.g., when the height of thickness of circuit structures is greater the thickness of integrated circuit 110 of FIG. 1A by more than 50%). In one exemplary embodiment, slots 145 may have a width dimension that ranges between 0.3 mm and 0.52 mm.

FIG. 1C, meant to be illustrative and not limiting, illustrates surface 125 of package substrate 120 of FIG. 1A in accordance with one embodiment of the present invention. Bump pads 126 and circuit structures 140 are shown on surface 125. Adhesive material 127 may be applied at the perimeter of surface 125 so that heat spreader 130 of FIG. 1A may be attached to package substrate 120.

Figure 2A:
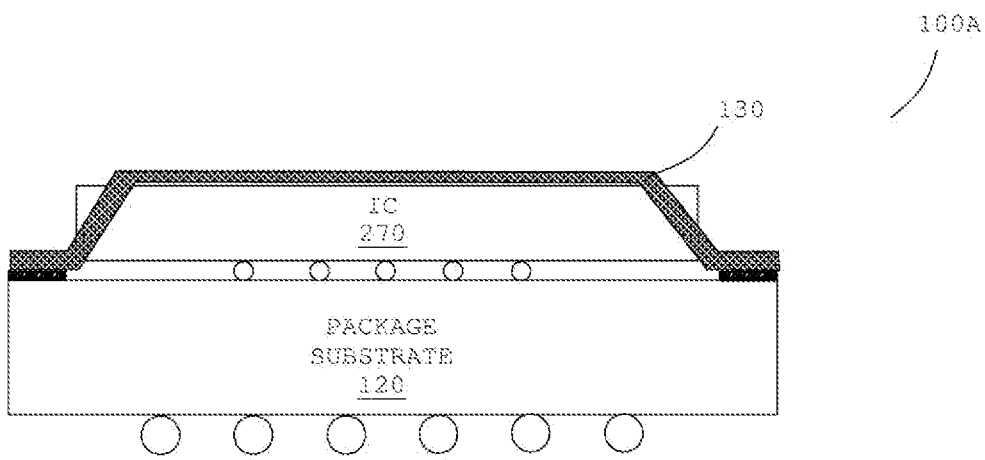
FIG. 2A shows a cross-sectional view of an illustrative integrated circuit package having a large integrated circuit mounted on top of a package substrate in accordance with one embodiment of the present invention.

FIG. 2A, meant to be illustrative and not limiting, illustrates a cross-sectional view of integrated circuit package 100A having a large integrated circuit mounted on top of a package substrate in accordance with one embodiment of the present invention. Integrated circuit package 100A shares similarities with integrated circuit package 100 of FIG. 1A. As such, specific details with respect to integrated circuit package 100A that have been described above will not be repeated for the sake of brevity.

As shown in the embodiment of FIG. 2A, integrated circuit package 100A includes integrated circuit 270. In one embodiment, integrated circuit 270 may be larger than integrated circuit 110 of FIG. 1A. However, the size of package substrate 120 remains the same even with a relatively larger integrated circuit 270. (It is noted that the drawings are provided for illustrative purposes only and are not drawn to scale.) Accordingly, heat spreader 130 may still be utilized for housing integrated circuit 270. The slots on heat spreader 130 provide openings so that corner-edges of integrated circuit 270 may be slotted through them. Heat spreader 130 may therefore enable a single package substrate 120 to be used for integrated circuits of different sizes.

Figure 2B:
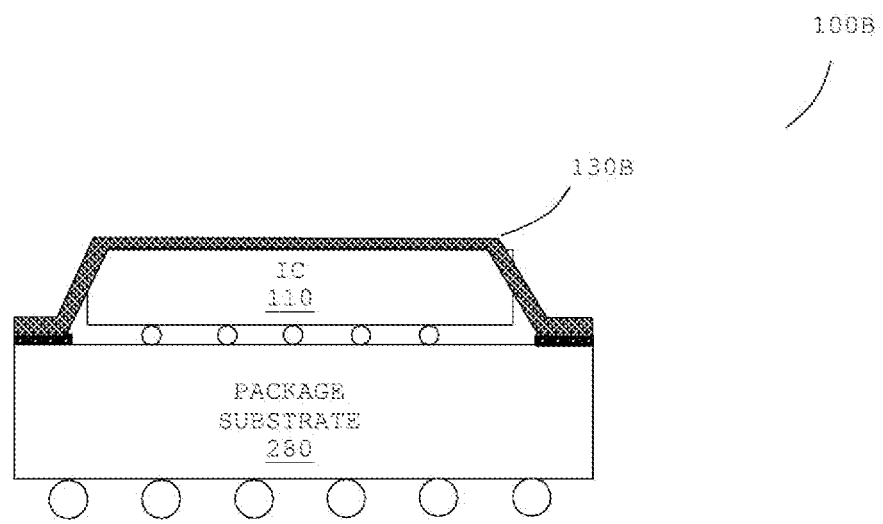
FIG. 2B shows a cross-sectional view of an illustrative integrated circuit package having an integrated circuit mounted on top of a small package substrate in accordance with one embodiment of the present invention.

FIG. 2B, meant to be illustrative and not limiting, illustrates a cross-sectional view of an integrated circuit package having an integrated circuit mounted on top of a small package substrate in accordance with one embodiment of the present invention. It should be appreciated that integrated circuit package 100B shares similarities with integrated circuit package 100 of FIG. 1A. As such, for the sake of brevity, specific details with respect to integrated circuit package 100B that have been described above are not repeated. In the embodiment of FIG. 1A, integrated circuit package 100B may not include circuit structures 140 of FIG. 1A. As such, package substrate 280 and heat spreader 130B may be relatively smaller in size compared to package substrate 120 and heat spreader 130, respectively, of FIG. 1A. The size of package substrate 280 may further be reduced by having slots on heat spreader 130B. The corner-edges of integrated circuit 110 may be slotted through the slots on heat spreader 130B.

FIGS. 3A-3D, meant to be illustrative and not limiting, illustrate top views of respective heat spreaders 200A-200D in accordance with embodiments of the present invention. Heat spreaders 200A-200D may have different numbers of slots 220. In one embodiment, either one of heat spreaders 200A-200D may be used in place of heat spreader 130 of FIGS. 1A and 1B. Mid-portion 230 in FIGS. 3A-3D may be similar to mid-portion 135 of FIG. 1 and therefore, for the sake of brevity will not described again.

Figure 3A:
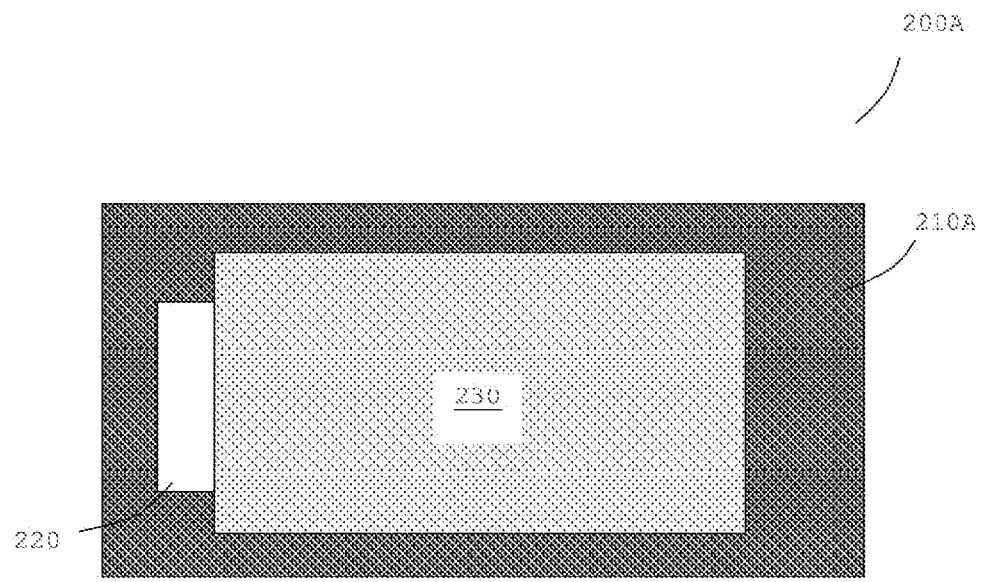
FIGS. 3A-3D show top views of different illustrative heat spreader designs having different numbers of slots in accordance with embodiments of the present inventions.

In FIG. 3A, heat spreader 200A includes one slot 220 located at one side of edge-portion 210A. Heat spreader 200A may be utilized when a circuit structure (e.g., circuit structure 140 of FIG. 1A) is placed adjacent to a single side of integrated circuit 110 of FIG. 1A. It should be noted that the location of slot 220 may correspond to the location of the circuit structure on the package substrate (not shown in FIG. 3A).

Figure 3B:
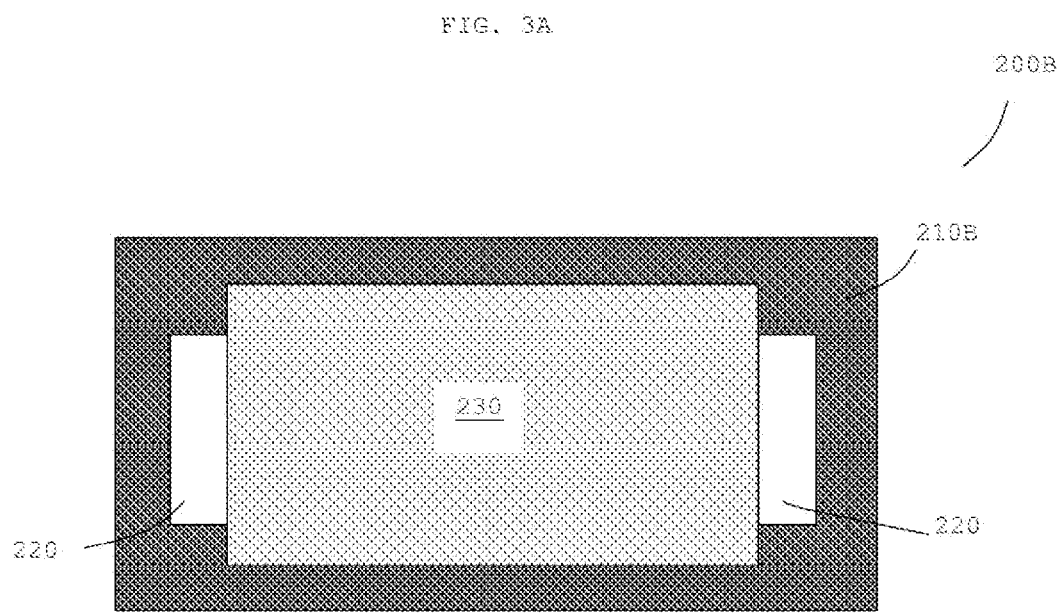

In FIG. 3B, heat spreader 200B includes two slots 220 (i.e., two slots on opposing sides of edge portion 210B of heat spreader 220B). Heat spreader 200B may be similar to heat spreader 130 of FIGS. 1A and 1B, which also have two slots. The cross-sectional view of heat spreader 200B may be similar to heat spreader 130 of FIGS. 1A and 1B, and heat spreader 200B may allow circuit structures (e.g., circuit structures 140 of FIGS. 1A and 1B) to be placed adjacent to two opposing sides of an integrated circuit (e.g., integrated circuit 110 of FIG. 1A).

In an alternative embodiment, the two slots 220 may be located on adjacent sides of edge-portion 210B, e.g., the left and top sides, the left and bottom sides of edge portion 210B. Alternatively, the two slots may be located on the right and top edge portion 210 sides or the right and bottom edge portion 210 sides. It should be appreciated that the reference of the left, right, top and bottom sides referring to the orientation as provided within FIG. 3B.

Figure 3C:
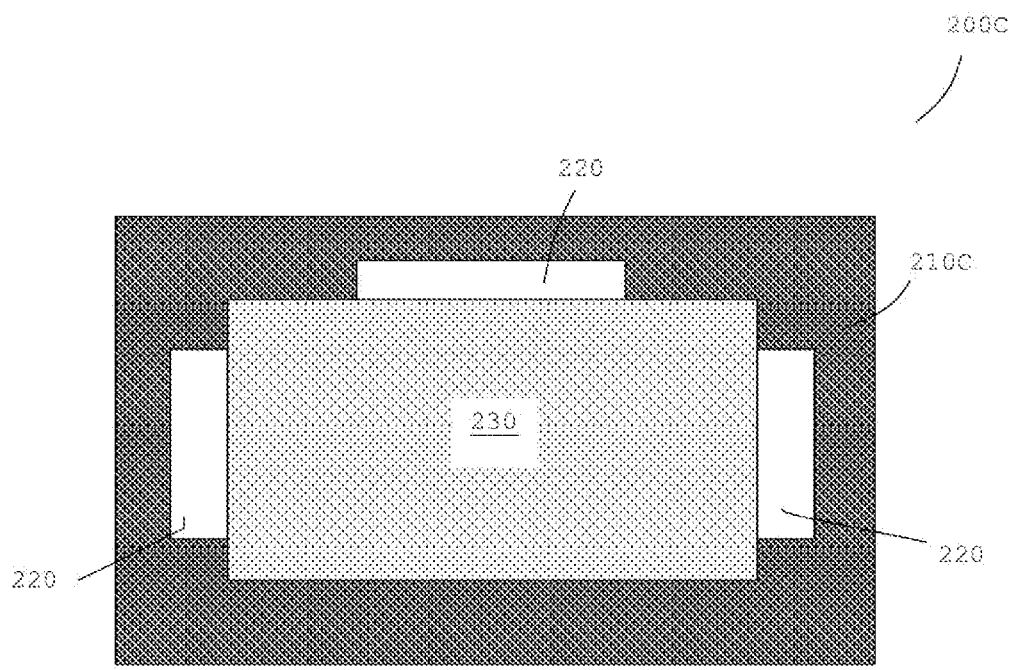
Figure 3D:
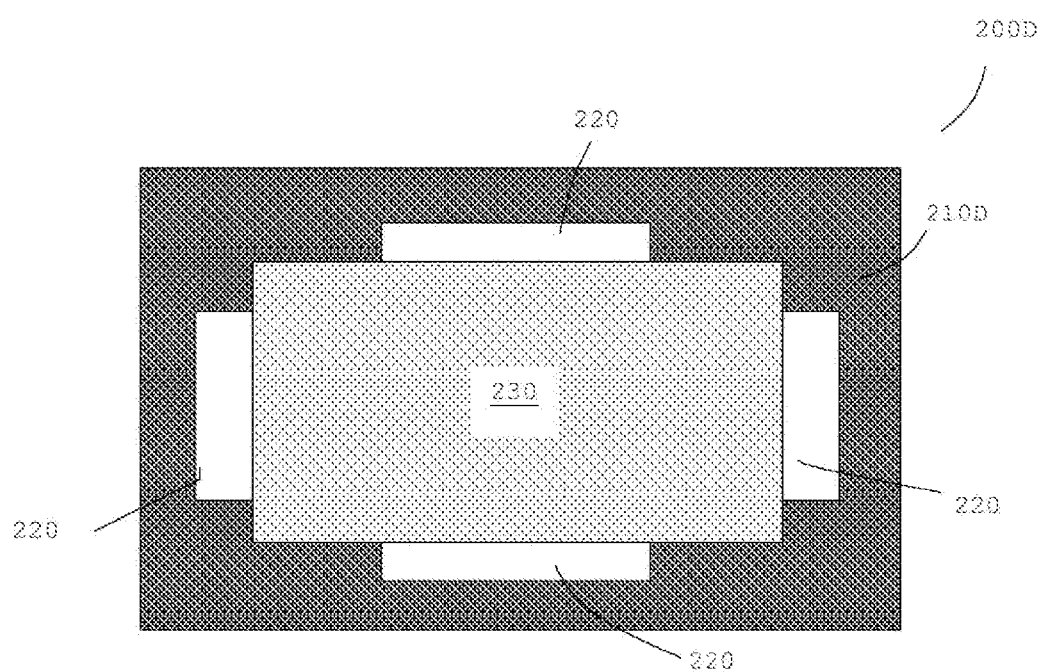

In FIG. 3C, heat spreader 200C includes three slots 220 on three sides of edge portion 210C. Heat spreader 200C may allow circuit structures to be placed on three edges of a package substrate. In FIG. 3D, heat spreader 200D with four slots 220, one on each side of edge-portion 210D of heat spreader 220C, is shown. Accordingly, heat spreader 200D may allow circuit structures to be placed on all edges of a package substrate.

In one embodiment (not shown in the embodiments of FIGS. 3A-3D), a heat spreader may have two slots similar to slot 220 on a single side. Such a configuration may enable two circuit structures (e.g., circuit structure 140 of FIG. 1A) to be placed adjacent to each other on a package substrate.

Figure 4:
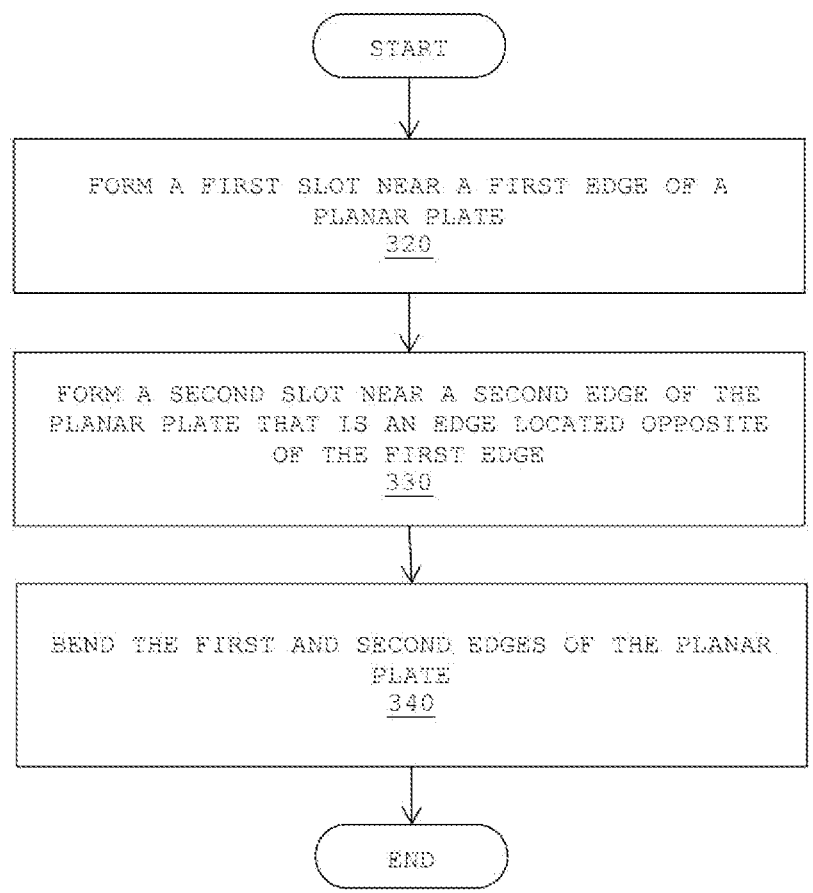
FIG. 4 shows an illustrative flowchart of illustrative steps for manufacturing a heat spreader in accordance with one embodiment of the present invention.

FIG. 4, meant to be illustrative and not limiting, shows illustrative steps to manufacture a heat spreader in accordance with one embodiment of the present invention. The manufactured heat spreader may be similar to heat spreader 130 of FIGS. 1A, 1B and 2A, or heat spreader 200B of FIG. 3B.

At step 320, a first slot is formed near a first edge of a planar plate. The planar plate may be a conductive material (e.g., copper) of a rectangular shape. The planar plate may be utilized for providing a maximum contact area between a heat spreader and a top surface of an integrated circuit as stated above. As an example, at this stage, the planar plate may be similar to heat spreader 200A of FIG. 3A. At step 330, a second slot is formed near a second edge of the planar plate. In one embodiment, the second edge is opposite to the first edge. As an example, at this stage, the planar plate may be similar to heat spreader 130 of FIG. 1B or heat spreader 220B of FIG. 3B. In another embodiment, as described with reference to FIG. 3B, the second edge may be adjacent to the first edge.

At step 340, the first and second edges of the planar plate are bent at an angle. In one embodiment, the planar plate may be bent to have an acute angle of approximately 45 degrees. The bending of the first and second edges may be performed through a bent structure. The angle of the bent structure follows the angle in which the first and second edges of the planar plate are to be bent.

Subsequently, end portions of the first and second edges of the planar plate may be bent one more time so that the end portions are flat to rest on a top surface of a package substrate. The manufactured heat spreader may be similar to heat spreader 130 of FIGS. 1A-1B or heat spreader 200B of FIG. 2B.

In some embodiments, additional steps (not shown) may be performed to form additional slots on the planar plate to produce a heat spreader similar to heat spreader 200C of FIG. 3C or heat spreader 200D of FIG. 3D.

Figure 5A:
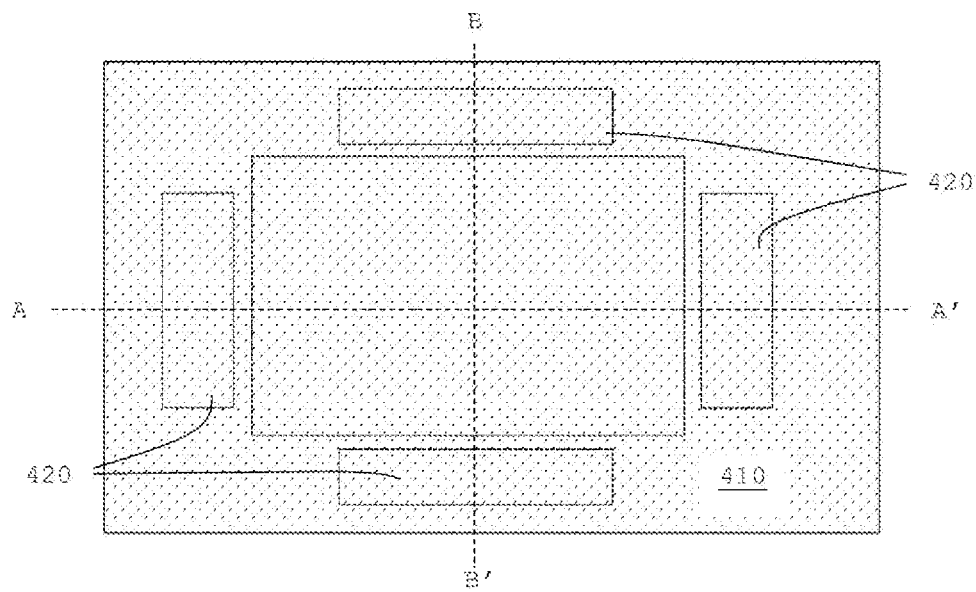
FIG. 5A shows a top view of an illustrative integrated circuit package in accordance with embodiments of the present invention.
Figure 5B:
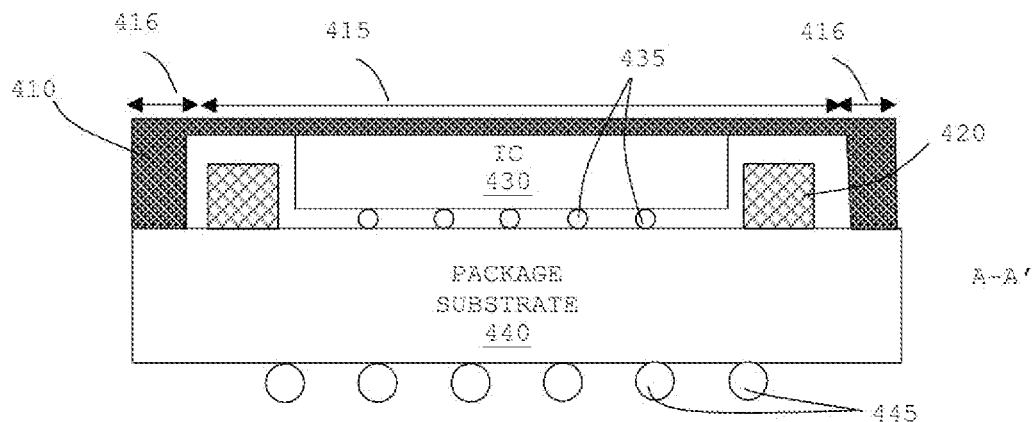
FIG. 5B shows a cross-sectional side view along the line A-A' of an illustrative integrated circuit package of FIG. 5A in accordance with embodiments of the present invention.
Figure 5C:
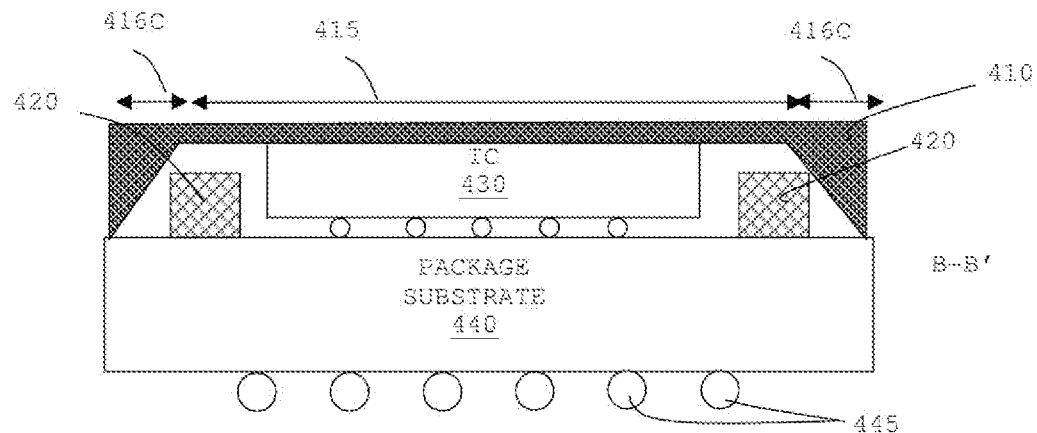
FIG. 5C shows a cross-sectional side view along the line B-B' of an illustrative integrated circuit package of FIG. 5A in accordance with embodiments of the present invention.

FIG. 5A, meant to be illustrative and not limiting, illustrates a top view of integrated circuit package in accordance with one embodiment of the present invention. The top view of heat spreader 410 includes a plurality of dotted lines exhibiting where circuit structures 420 and integrated circuit 430 of FIGS. 5B and 5C are placed underneath the heat spreader 410. Cross-sectional views of the integrated circuit package of FIG. 5A across lines A-A' and B-B' may be shown in FIGS. 5B and 5C, respectively.

In one embodiment, heat spreader 410 may be a fairly rectangular channel heat spreader structure with two perpendicular edges and two additional edges (e.g., slanted edges 416C of FIG. 5C). Each additional edge may have an inner edge that is slanted and an outer edge that is perpendicular. It should be appreciated that commonly available rectangular heat spreader structures may only have two perpendicular structures on two edges of heat spreader structure. The other two sides of the fairly rectangular heat spreader structure may form a channel pathway for air to travel through. However, for heat spreader 410, the two additional edges formed on those sides.

FIGS. 5B and 5C, meant to be illustrative and not limiting, illustrate cross-sectional views along the respective lines A-A' and B-B' of the integrated circuit package of FIG. 5A in accordance with embodiments of the present invention. The integrated circuit package shares similarities with integrated circuit package 100, and for the sake of brevity, elements that have been described such as integrated circuit 430, package substrate 440, circuit structures 420, interconnects 435 and solder balls 445 will not be repeated.

FIG. 5B shows a cross-sectional view of the integrated circuit package along the line A-A' as shown in FIG. 5A. In FIG. 5B, heat spreader 410 is mounted on integrated circuit 430. The cross-sectional view along the line A-A' shows heat spreader 410 with two perpendicular edges 416 and mid-portion 415 forming a channel. Integrated circuit 430 may be located in the middle of the channel.

FIG. 5C shows a cross-sectional view of the integrated circuit package along the line B-B' as shown in FIG. 5A. The cross-sectional view along the line B-B' shows two edges 416C that has a slanted inner side and a perpendicular outer side. As shown in FIG. 5C, the slanted inner side of edges 416C may be attach to the top surface of package substrate 440. Alternatively, the slanted inner side of edges 416C may not attach to the top surface of package substrate 440. In such embodiment, edges 416C may only form a partial length of edges 416 of FIG. 5B.

Figure 6:
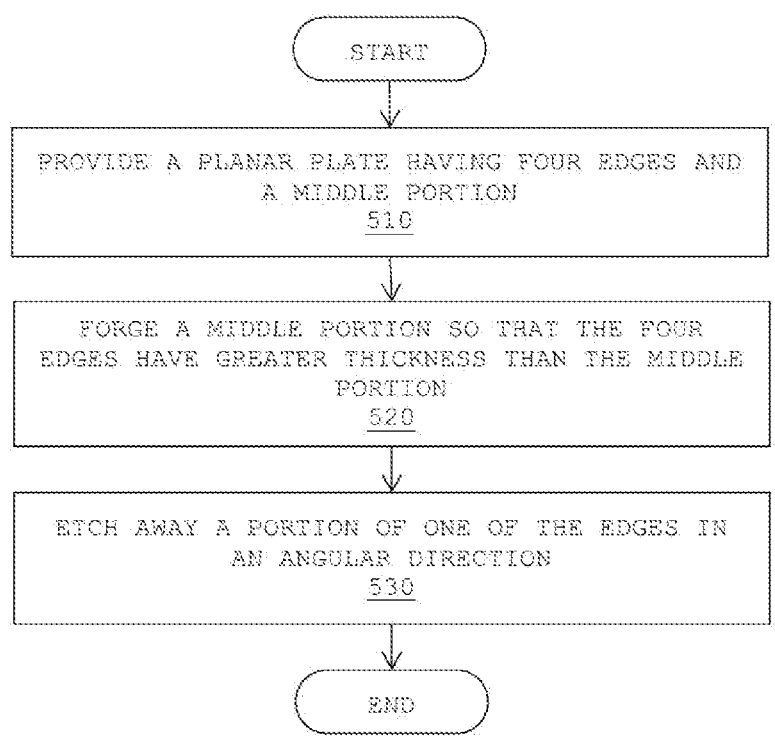
FIG. 6 shows a flowchart of illustrative steps for manufacturing a channel heat spreader with slanted edges in accordance with one embodiment of the present invention.

FIG. 6, meant to be illustrative and not limiting, shows illustrative steps for manufacturing a channel heat spreader with slanted edges in accordance with one embodiment of the present invention. The channel heat spreader with slanted inner side for the edges may be similar to heat spreader 410 of FIGS. 5A-5C, with edges 416C at the channel of the heat spreader.

At step 510, a planar plate that is fairly rectangular is provided. The planar plate may include four edges and a middle-portion. At step 520, the middle portion is forged so that the four edges may have a thickness that is greater than the middle portion. The profile of the heat spreader (i.e., thick edges and a relatively thinner middle portion) may be similar to heat spreader 410 of FIG. 5B.

At step 530, a portion of one of the edges is etched at an angular direction. The etching may be performed using an etching process, e.g., dry etching process. After the etching process, the edges may be similar to edges 416C of FIG. 5C. The manufactured heat spreader structure may have a profile similar to heat spreader 410 of FIGS. 5A-5C.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. An integrated circuit heat spreading structure, comprising:
   a planar portion; and
   a slanted portion that extends at an angle from an edge of the planar portion, wherein a slot is formed in the slanted portion, wherein the integrated circuit heat spreading structure forms a part of an integrated circuit package that includes a package substrate, an integrated circuit mounted on the package substrate, and a passive device mounted on the package substrate adjacent to the integrated circuit, wherein the integrated circuit is interposed between the package substrate and the integrated circuit heat spreading structure, and wherein a top portion of the passive device penetrates through the slot in the integrated circuit heat spreading structure.

2. The integrated circuit heat spreading structure as defined in claim 1, further comprising:

an additional slanted portion that extends at an angle from another edge of the planar portion.

3. The integrated circuit heat spreading structure as defined in claim 2, wherein an additional slot is formed in the additional slanted portion of the heat spreading structure.

4. The integrated circuit heat spreading structure as defined in claim 1, wherein an additional slot is formed in the slanted portion and is adjacent to the slot.

5. The integrated circuit heat spreading structure as defined in claim 1, wherein the passive device comprises an on-package diode (OPD).

6. The integrated circuit heat spreading structure as defined in claim 5, wherein dimensions of the first slot is larger than a dimension of the on-package diode.

7. The integrated circuit heat spreading structure as defined in claim 1, wherein an acute angle between the slanted portion and the edge of the planar portion is approximately 45 degrees.

8. An integrated circuit package, comprising:

a package substrate;

an integrated circuit mounted on the package substrate;

a heat spreader structure mounted on the package substrate, wherein the heat spreader structure has a slot, a planar member that is formed over the integrated circuit, a first periphery edge member that extends only perpendicularly from a first edge of the planar member and makes contact with the package substrate, and a second periphery edge member that extends from a second edge of the planar member, that has a slanted inner side with respect to that of the planar member, and that makes contact with the package substrate; and a passive component that is mounted on the package substrate and that extends at least partially through the slot.

9. The integrated circuit package as defined in claim 8, wherein the heat spreader structure further comprises a third edge member that extends perpendicularly from a third edge of the planar member, and wherein the first and third edges are on opposing edges of the planar member.

10. The integrated circuit package as defined in claim 9, wherein the heat spreader structure further comprises a fourth edge member that extends from a fourth edge of the planar member and that has a slanted inner side with respect to that of the planar member, and wherein the second and fourth edges are on opposing edges of the planar member.

11. The heat spreader structure as defined in claim 8, wherein an acute angle between the slanted inner side and the planar member is equal to 45 degrees.

12. An integrated circuit package, comprising:

a substrate;

an integrated circuit die mounted on the substrate;

a heat spreading structure that is formed on the integrated circuit die and that has a slanted portion that includes a slot; and at least one electrical component within the integrated circuit package that extends at least partially through the slot.

13. The integrated circuit package defined in claim 12, wherein the at least one electrical component comprises a discrete capacitor component.

14. The integrated circuit package defined in claim 12, wherein the at least one electrical component comprises a discrete diode component.

15. The integrated circuit package defined in claim 12, wherein the heat spreading structure has a planar portion that is thermally coupled to the integrated circuit die and the slanted portion.

16. The integrated circuit package defined in claim 12, wherein the heat spreading structure further includes at least one additional slot.

17. The integrated circuit package defined in claim 12, wherein the heat spreading structure includes slots formed on only two opposing edges.

* * * * *